United States Patent
Yamaji

(10) Patent No.: US 6,707,160 B2
(45) Date of Patent: Mar. 16, 2004

(54) SEMICONDUCTOR DEVICE USING SUBSTRATE HAVING CUBIC STRUCTURE AND METHOD OF MANUFACTURING THE SAME

(75) Inventor: Yasuhiro Yamaji, Tsukuba (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 15 days.

(21) Appl. No.: 09/871,671

(22) Filed: Jun. 4, 2001

(65) Prior Publication Data

US 2001/0049155 A1 Dec. 6, 2001

(30) Foreign Application Priority Data

Jun. 5, 2000 (JP) .................................. 2000-167878

(51) Int. Cl.[7] .................... H01L 29/40; H01L 21/44; H01L 21/46
(52) U.S. Cl. .................. 257/778; 257/777; 257/780; 257/784; 257/618; 257/625; 257/678; 257/731; 438/106; 438/108; 438/455; 438/458; 438/977
(58) Field of Search ................. 257/777, 778, 257/780, 784, 678, 731, 618, 625, 782; 438/106, 108, 455

(56) References Cited

U.S. PATENT DOCUMENTS

| 3,755,891 A | * | 9/1973 | Muckelroy et al. ............ 29/846 |
| 4,528,748 A | * | 7/1985 | Eichelberger et al. ......... 29/835 |
| 4,810,917 A | * | 3/1989 | Kumar et al. .............. 310/68 R |
| 4,962,495 A | * | 10/1990 | Gibbons et al. ............ 398/114 |
| 5,203,721 A | * | 4/1993 | Buck ........................... 439/581 |
| 5,673,131 A | * | 9/1997 | Jacobsen ..................... 398/141 |
| 5,907,106 A | * | 5/1999 | Segar ....................... 73/862.338 |
| 6,121,689 A | * | 9/2000 | Capote et al. .............. 257/773 |
| 6,137,164 A | * | 10/2000 | Yew et al. ................... 257/686 |
| 6,492,725 B1 | * | 12/2002 | Loh et al. .................... 257/723 |
| 6,515,346 B1 | * | 2/2003 | Kemeny ..................... 257/618 |

FOREIGN PATENT DOCUMENTS

| JP | 63-84056 | * | 4/1988 |
| JP | 02-106821 | * | 4/1990 |
| JP | 402275376 | * | 11/1990 |
| JP | 9-107129 | * | 4/1997 |

OTHER PUBLICATIONS

Mitsuru Oida et al.; "Semiconductor Device Including Integrated Circuits on a Polyhedral Semiconductor"; US patent application Ser. No. 09/499,692, f iled Feb. 8, 2000.

Kevin Chen et al.; "Ultra–Thin Electronic Device Package"; 1999 Electronic Components and Technology Conference; IEEE.

* cited by examiner

*Primary Examiner*—John B. Vigushin
*Assistant Examiner*—James Mitchell
(74) *Attorney, Agent, or Firm*—Finnegan, Henderson, Farabow, Garrett & Dunner, L.L.P.

(57) ABSTRACT

A plurality of semiconductor chips bent along the outer circumferential surface of a cylindrical substrate are mounted to the outer circumferential surface of the substrate. The bumps of these semiconductor chips are connected to connection pads formed on the outer circumferential surface of the substrate. By diminishing the curvature radius of the bent semiconductor chips, the size of the semiconductor module can be made smaller than the size of the chip.

33 Claims, 10 Drawing Sheets

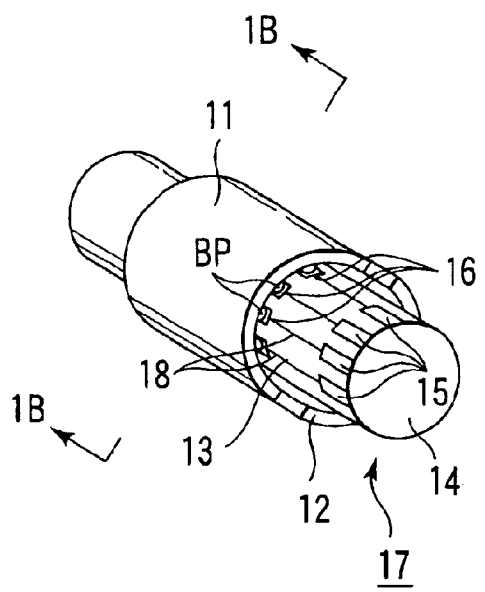
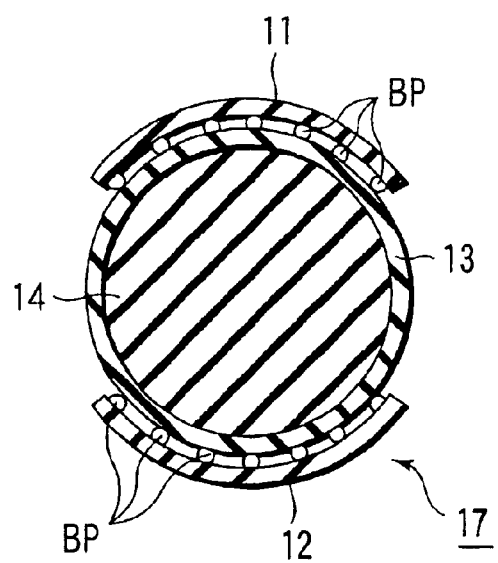
FIG. 1A   FIG. 1B
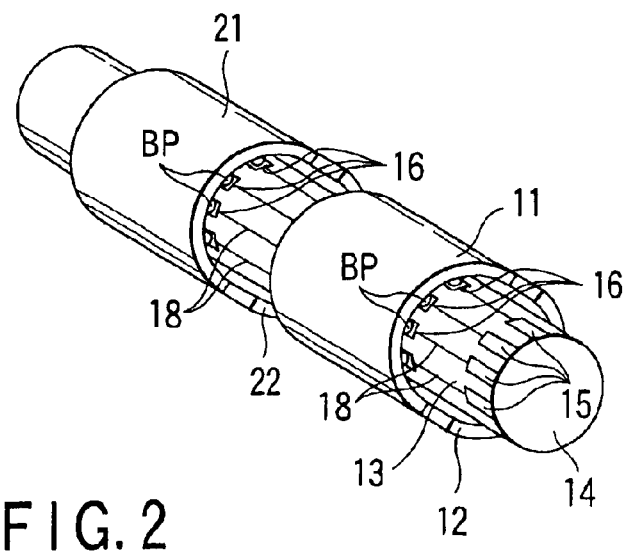
FIG. 2

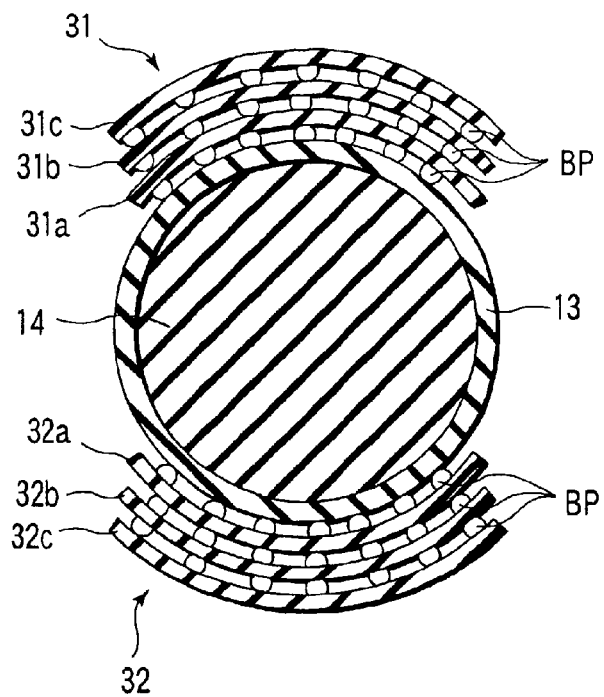
F I G. 3
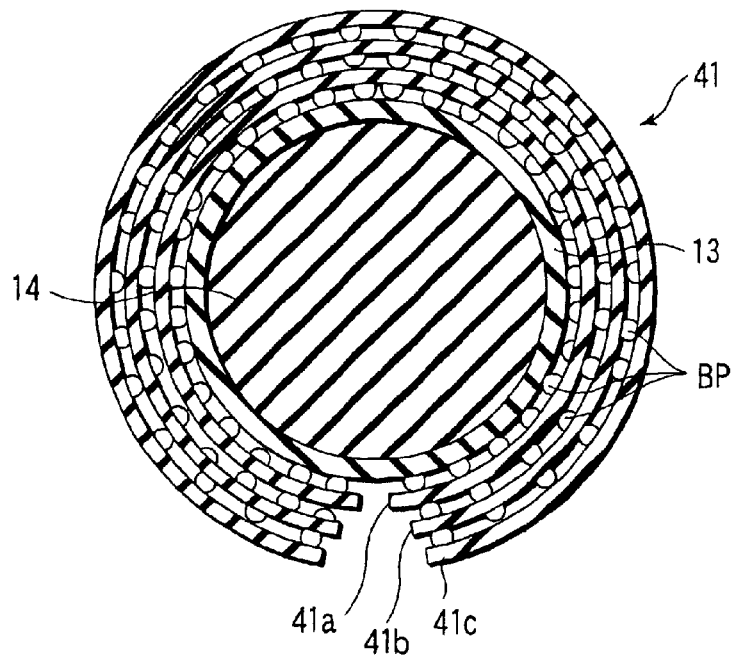
F I G. 4

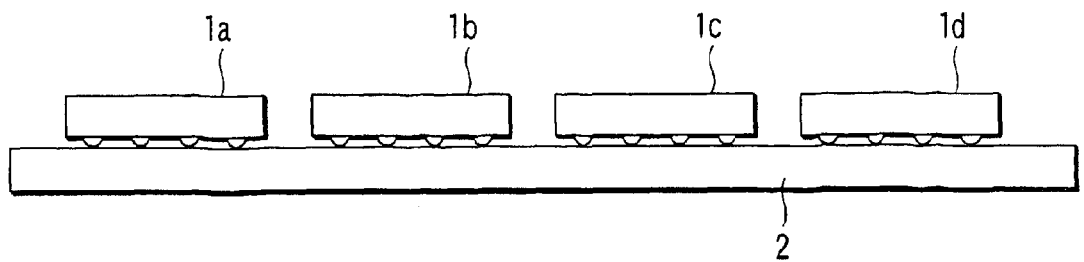
F I G. 16
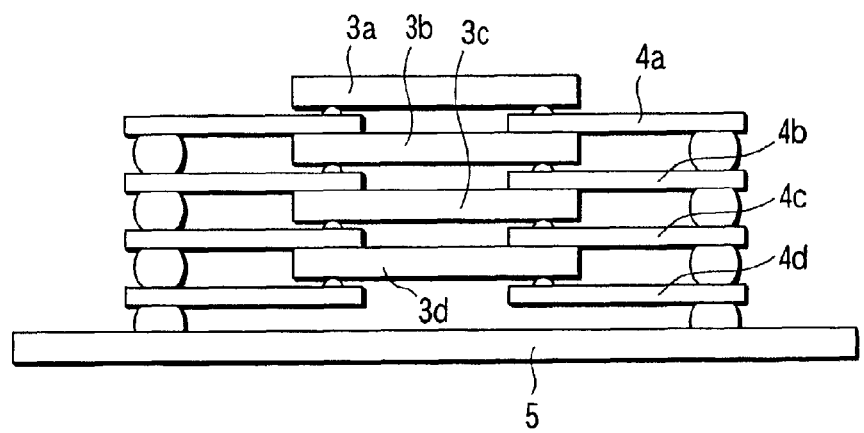
F I G. 17
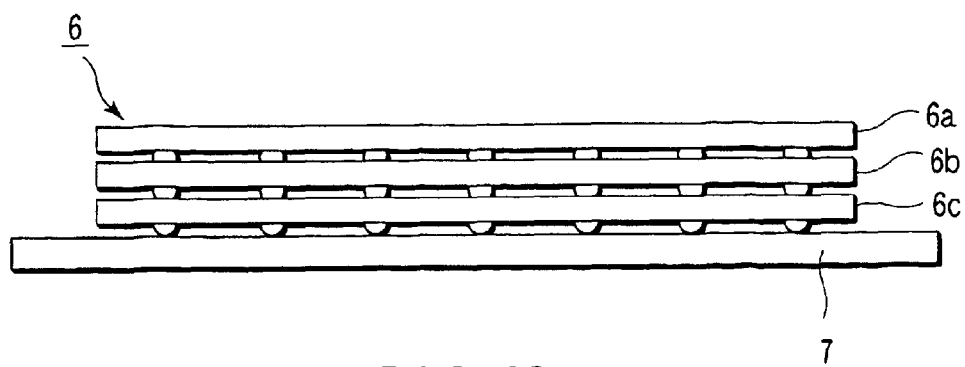
F I G. 18

SEMICONDUCTOR DEVICE USING SUBSTRATE HAVING CUBIC STRUCTURE AND METHOD OF MANUFACTURING THE SAME

CROSS-REFERENCE TO RELATED APPLICATIONS

This application is based upon and claims the benefit of priority from the prior Japanese Patent Application No. 2000-167878, filed Jun. 5, 2000, the entire contents of which are incorporated herein by reference.

BACKGROUND OF THE INVENTION

The present invention relates to a semiconductor module having, for example, a plurality of semiconductor chips mounted in a three dimensional direction, particularly, to a semiconductor memory module requiring miniaturization and a method of manufacturing the same.

The semiconductor module mounted to, for example, a personal computer or a portable terminal apparatus is required to have a large capacity and to be miniaturized.

FIGS. 16 to 18 show conventional semiconductor modules. FIG. 16 covers the case where a plurality of semiconductor chips are mounted in a two dimensional direction. In FIG. 16, a plurality of semiconductor chips or a plurality of CSP's (Chip Scale Packages) 1a, 1b, 1c and id are mounted on the same surface of plate-like printed circuit board 2.

FIG. 17 exemplifies the case where a plurality of semiconductor chips are mounted in a three dimensional direction. In FIG. 17, a plurality of semiconductor chips 3a, 3b, 3c and 3d are mounted to a thin type packages 4a, 4b, 4c and 4d, respectively, such as TCP's (Tape Carrier Packages). These packages 4a, 4b, 4c and 4d are stacked one upon the other so as to form a stacked body. The stacked body thus prepared is mounted to a plate-like printed circuit board 5.

FIG. 18 exemplifies another three dimensional mounting and is directed to the case where a plurality of bare chips are stacked one upon the other. In this case, a stacked body 6 includes a plurality of semiconductor chips 6a, 6b, 6c stacked one upon the other. The stacked body 6 is mounted to a plate-like printed circuit board 7.

Where a plurality of semiconductor chips are mounted in a two dimensional direction as shown in FIG. 16, the area of the printed circuit board 2 is increased in proportion to the increase in the number of chips. As a result, the mounting area of the entire semiconductor module having a plurality of semiconductor chips mounted to a printed circuit board is increased, resulting in failure to miniaturize sufficiently the semiconductor module.

In the case of the three dimensional mounting as shown in FIGS. 17 and 18, it is certainly possible to increase the mounting density, compared with the two dimensional mounting shown in FIG. 16. However, in the case of the three dimensional mounting shown in FIG. 17, the mounting area depends on the size of the packages 4a, 4b, 4c, 4d, and the volume of the semiconductor module is increased with increase in the number of stacks of the packages. As a result, it is difficult to make the size of the semiconductor module smaller than the size of the package. Also, in the case of the three dimensional mounting shown in FIG. 18, the mounting area depends on the size of the bare chip, making it difficult to make the size of the semiconductor module smaller than the size of the chip.

As described above, in the conventional semiconductor module, the size of the module is limited by the size of the package or chip, making it difficult to sufficiently miniaturize the semiconductor module.

BRIEF SUMMARY OF THE INVENTION

An object of the present invention is to provide a semiconductor device that permits making the size of a semiconductor module smaller than the size of the chip and a method of manufacturing the same.

According to a first aspect of the present invention, there is provided a semiconductor device, comprising a cylindrical substrate, and at least one semiconductor chip mounted on the circumferential surface of the substrate, the semiconductor chip being bent along the surface of the substrate.

According to a second aspect of the present invention, there is provided a semiconductor device, comprising a cylindrical substrate, and at least one stacked body formed on the circumferential surface of the substrate, the stacked body including a plurality of semiconductor chips stacked one upon the other and being bent along the surface of the substrate.

According to a third aspect of the present invention, there is provided a method of manufacturing a semiconductor device, comprising the steps of: bending at least one semiconductor chip; and mounting the bent semiconductor chip on at least one region of the surface of a cylindrical substrate.

Further, according to a fourth aspect of the present invention, there is provided a method of manufacturing a semiconductor device, comprising the steps of: mounting at least one semiconductor chip on at least a region of the surface of a flexible substrate; and bending the substrate into a cylindrical form.

According to the present invention, a semiconductor substrate comprises a cylindrical substrate and at least one bent semiconductor chip arranged on the substrate. The size of the semiconductor module can be made smaller than the size of the chip by diminishing the curvature radius of the bent semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is an oblique view showing a first embodiment of the present invention;

FIG. 1B is a cross sectional view along the line 1B—1B shown in FIG. 1A;

FIG. 2 is an oblique view showing a second embodiment of the present invention;

FIG. 3 is a cross sectional view showing a third embodiment of the present invention;

FIG. 4 is a cross sectional view showing a fourth embodiment of the present invention;

FIG. 16 is a side view showing an example of a conventional semiconductor module;

FIG. 17 is a side view showing another example of a conventional semiconductor module; and FIG. 18 is a side view showing still another example of a conventional semiconductor module.

DETAILED DESCRIPTION OF THE INVENTION

Figure 5A:
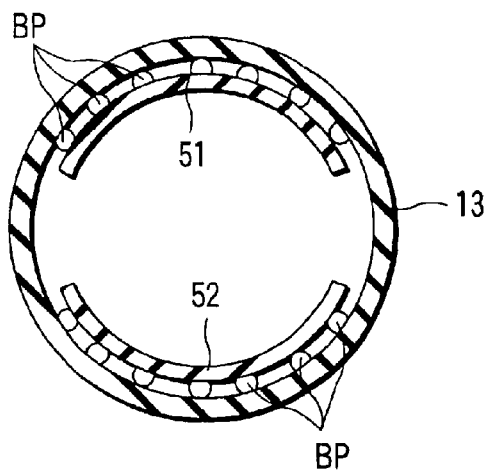
FIG. 5A is a cross sectional view showing a fifth embodiment of the present invention, which is a modification of the first embodiment shown in FIG. 1.

Some embodiments of the present invention will now be described with reference to the accompanying drawings.
(First Embodiment)

FIGS. 1A and 1B collectively show a semiconductor device according to a first embodiment of the present invention. In this semiconductor device, a plurality of semiconductor chips and a flexible substrate are mounted in a three dimensional direction so as to form a semiconductor module.

As shown in FIGS. 1A and 1B, each of semiconductor chips 11 and 12 comprises, for example, a plurality of bumps BP formed on one surface. These semiconductor chips 11 and 12 are bent such that the surfaces having the bumps BP mounted thereon face inward. The bent semiconductor chips 11 and 12 are mounted to the outer surface of a cylindrical substrate 13 a predetermined distance apart from each other in the circumferential direction. For example, a plurality of connection terminals 15, a plurality of connection pads 16 and a plurality of printed wirings 18 are formed on the surface of the substrate 13. The connection terminals 15 are connected to the connection pads 16 by the printed wirings 18. The bumps BP of the semiconductor chips 11 and 12 are electrically connected to these pads 16. A reinforcing body 14 made of, for example, an insulating material is housed inside the substrate 13. An adhesive (not shown) is interposed between the reinforcing body 14 and the substrate 13 so as to achieve bonding between the reinforcing body 14 and the substrate 13. It is possible to omit the reinforcing body 14 in the case where the substrate 13 has a sufficiently high mechanical strength.

As shown in FIG. 1A, the connection terminals 15 are mounted to the outer circumferential surface of the substrate 13 in one edge portion in the longitudinal direction of the substrate 13. The mounting position of these terminals 15 is not limited to the outer circumferential surface of the substrate 13. It is also possible to mount these terminals 15 on the inner circumferential surface of the substrate 13. What should be noted that the mounting position of the terminals 15 is determined in accordance with the shape of the connector (not shown) connected to these terminals 15. Where, for example, the connector is a female type connector, the terminals 15 are mounted on the outer circumferential surface of the substrate 13 as shown in FIG. 1A. On the other hand, where the connector is a male type connector, the terminals 15 are mounted on the inner circumferential surface of the substrate 13.

A semiconductor module 17 comprising a plurality of semiconductor chips 11 and 12 can be prepared as described above. Where the semiconductor chips 11 and 12 are formed of, for example, semiconductor memories, a semiconductor memory module can be obtained.

In general, each of the semiconductor chips 11 and 12 has a thickness of about 10 $\mu$m to 50 $\mu$m. Where the chip has a thickness of this level, the chip exhibits a flexibility and can be bent easily, though a silicon material originally exhibits a rigidity. For preparing a semiconductor chip having a thickness of this level, it is possible to employ, for example, a so-called "back side grinding process", in which the back surface of the wafer is polished after a semiconductor device is formed in the wafer. Incidentally, the method of bending the semiconductor chip will be described herein later.

In general, the circuit characteristics of a semiconductor chip are affected by stress. Therefore, deterioration in the characteristics of the semiconductor chip are worried about, if the thickness of the semiconductor chip is decreased, and if the semiconductor chip is bent. The degree of deterioration in the characteristics depends on the kind of the semiconductor. However, when it comes to a semiconductor memory, it is possible to prevent the characteristics from being deteriorated in the case where the thickness of the semiconductor chip falls within a range of about 10 $\mu$m and 50 $\mu$m.

Also, when it comes to a semiconductor chip of, for example, 10 mm□, the semiconductor chip was not affected by the stress even in the case where the semiconductor chip was bent into a cylindrical form having a diameter not larger than one third of the width of the semiconductor chip, e.g., about 3 mm of the diameter.

According to the first embodiment described above, the semiconductor chips 11 and 12 are bent, and the bent semiconductor chips 11 and 12 are mounted to the outer circumferential surface of the cylindrical substrate 13. Therefore, the size of the semiconductor module can be made smaller than the size of the chip by diminishing the curvature radius of the bent semiconductor chips 11 and 12. It follows that it is possible to save the mounting space of the apparatus to which the semiconductor module is mounted.

In the first embodiment, the semiconductor chips 11 and 12 were bent and mounted on the substrate 13. However, the present invention is not limited to the particular embodiment. For example, the similar effect can be obtained by bending a film-like package having a semiconductor chip mounted thereon and mounting the bent package to the substrate 13.

(Second Embodiment)

FIG. 2 shows a second embodiment of the present invention. The members shown in FIG. 2, which are equal to those included in the first embodiment described above, are denoted by the same reference numerals so as to avoid the overlapping description. FIG. 2 is a modification of the construction shown in FIG. 1A. In FIG. 2, bent semiconductor chips 21 and 22 are further mounted to the outer circumferential surface of the substrate 13. These semiconductor chips 21 and 22 are arranged a predetermined distance apart from the semiconductor chips 11, 12 referred to previously in the longitudinal direction of the substrate 13.

According to the second embodiment, a plurality of semiconductor chips are arranged in the longitudinal direction of the substrate 13, making it possible to mount a large number of semiconductor chips to the substrate 13. It follows that the mounting density can be further increased, compared with the first embodiment.

(Third Embodiment)

FIG. 3 shows a third embodiment of the present invention. The members shown in FIG. 3, which are equal to those included in the first embodiment described above, are denoted by the same reference numerals so as to avoid the overlapping description.

The third embodiment shown in FIG. 3 comprises stacked bodies 31 and 32. The stacked body 31 includes a plurality of stacked semiconductor chips 31a, 31b, 31c and is bent. The stacked body 32 also includes a plurality of stacked semiconductor chips 32a, 32b, 32c and is bent. These stacked bodies 31 and 32 are mounted to the outer circumferential surface of the substrate 31 a predetermined distance apart from each other in the circumferential direction.

According to the third embodiment, a plurality of semiconductor chips are stacked one upon the other to form the stacked bodies 31 and 32, and these stacked bodies 31 and 32 are bent and arranged on the substrate 13. As a result, the mounting density can be further increased, compared with the first embodiment.

In the third embodiment, it is possible to prepare the stacked bodies 31 and 32 by stacking a plurality of film-like packages each having a semiconductor chip mounted thereto in place of stacking the semiconductor chips themselves. The similar effect can be obtained in the case of bending the stacked film-like packages and mounting the bent packages to the substrate 13.

(Fourth Embodiment)

FIG. 4 shows a fourth embodiment of the present invention. The members shown in FIG. 4, which are equal to those included in the first embodiment described above, are denoted by the same reference numerals so as to avoid the overlapping description.

The fourth embodiment shown in FIG. 4 comprises a stacked body 41 including a plurality of stacked semiconductor chips 41a, 41b and 41c, which are bent in a cylindrical form. The stacked body 41 is mounted to substantially the entire outer circumferential surface of the substrate 13.

According to the fourth embodiment, the semiconductor chips 41a, 41b and 41c are mounted to substantially the entire outer circumferential surface of the substrate 13. Where the length of one side of each of these semiconductor chips 41a, 41b, 41c is assumed to be equal to the length of one side of each of the semiconductor chips 31a, 31b, 31c for the third embodiment, the curvature radius of each of the semiconductor chips 41a, 41b, 41c is smaller than that of the semiconductor chips 31a, 31b, 31c. Naturally, the diameter of the substrate 13 for the fourth embodiment is smaller than that for the third embodiment. It follows that the size of the semiconductor module can be further diminished.

(Fifth Embodiment)

Figure 5B:
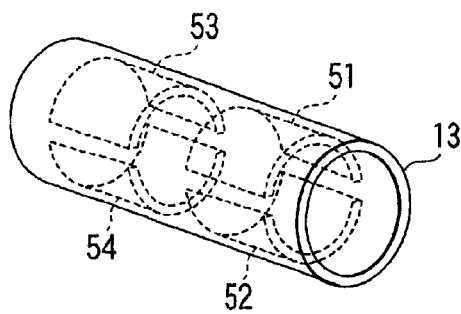
FIG. 5B is an oblique view showing a fifth embodiment of the present invention, which is a modification of the second embodiment shown in FIG. 2.
Figure 6:
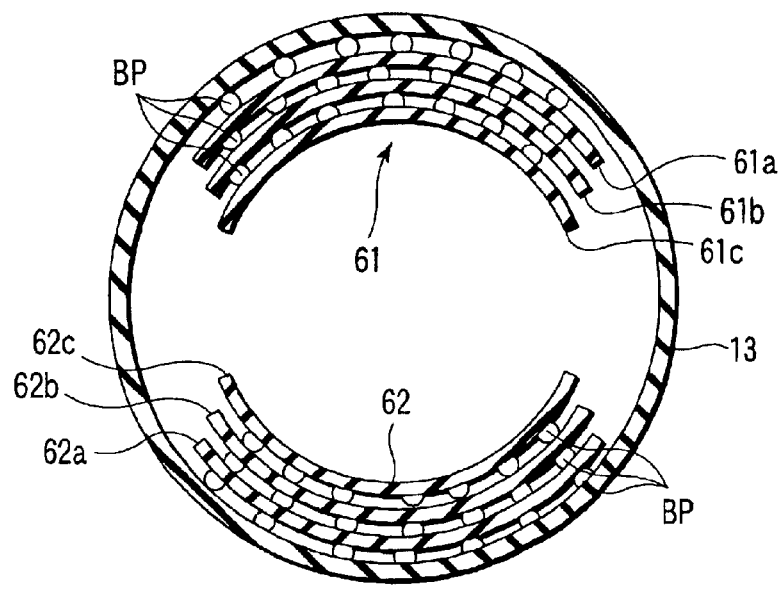
FIG. 6 is a cross sectional view showing a fifth embodiment of the present invention, which is a modification of the fifth embodiment shown in FIG. 5.
Figure 7:
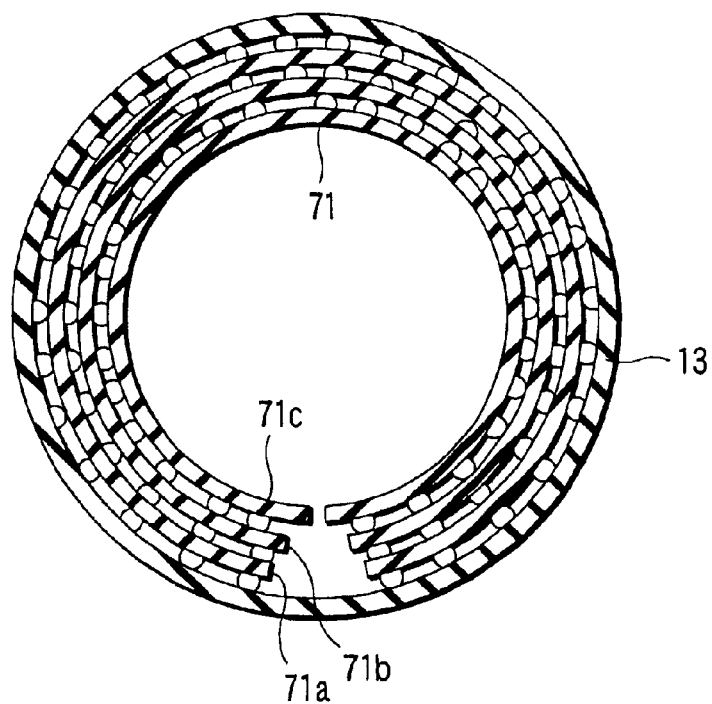
FIG. 7 is a cross sectional view showing a fifth embodiment of the present invention, which is a modification of the fifth embodiment shown in FIG. 5.

FIGS. 5, 6 and 7 show a fifth embodiment of the present invention. The members shown in FIGS. 5, 6 and 7, which are equal to those shown in FIGS. 1, 3 and 4, are denoted by the same reference numerals so as to avoid the overlapping description. In the fifth embodiment, the semiconductor chips are bent and mounted to the inner circumferential surface of the substrate 13.

FIG. 5A corresponds to the first embodiment and differs from the first embodiment in that semiconductor chips 51, 52 are bent such that the bumps BP are positioned on the outer surface. Also, for example, wirings (not shown) and connection pads connected to these wirings are arranged on the inner circumferential surface of the cylindrical substrate 13. The bent semiconductor chips 51, 52 are arranged on the inner circumferential surface of the substrate 13, and the bumps BP are connected to the connection pads. Also, in this case, a plurality of terminals 15 shown in FIG. 1 are arranged on the inner circumferential surface of the substrate 13.

FIG. 5B corresponds to FIG. 2. In this case, semiconductor chips 53, 54 are arranged a predetermined distance apart from the semiconductor chips 51, 52 in the longitudinal direction of the substrate 13.

FIG. 6 corresponds to the third embodiment and differs from the third embodiment in that a stacked body 61 including semiconductor chips 61a, 61b, 61c and another stacked body 62 including semiconductor chips 62a, 62b, 62c are bent such that the bumps BP are positioned on the outer surfaces. These bent stacked bodies 61 and 62 are mounted to the inner circumferential surface of the substrate 13.

FIG. 7 corresponds to the fourth embodiment and differs from the fourth embodiment in that a stacked body 71 including semiconductor chips 71a, 71b, 71c are bent such that the surfaces of these semiconductor chips on which the bumps BP are formed are positioned outside. The bent stacked body 71 is mounted to the inner circumferential surface of the substrate 13 as in the embodiment shown in FIG. 5A.

The fifth embodiment also permits producing the effect similar to that produced by the first and third embodiment. In addition, the substrate 13 can be utilized as the casing since the semiconductor chips 11 and 12 and the stacked bodies 31, 32 and 41 are mounted on the inner circumferential surface of the substrate 13.

Incidentally, it is possible to arrange the reinforcing body 14 inside the substrate 13 in the fifth embodiment.

(Sixth Embodiment)

Figure 8:
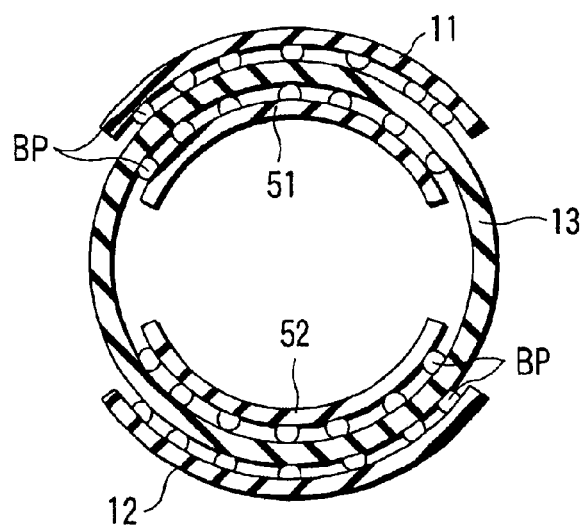
FIG. 8 is a cross sectional view showing a sixth embodiment of the present invention.
Figure 9:
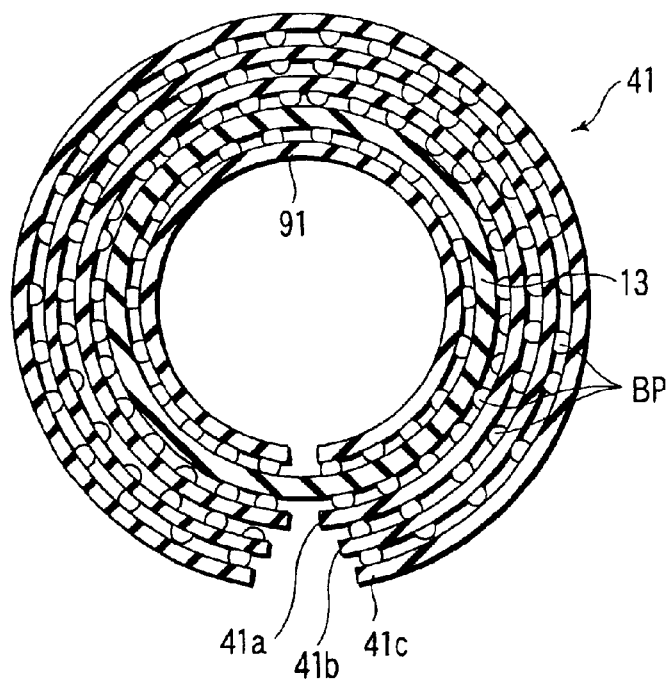
FIG. 9 is a cross sectional view showing a sixth embodiment of the present invention, which is a modification of the sixth embodiment shown in FIG. 8.

FIGS. 8 and 9 collectively show a sixth embodiment of the present invention. In the sixth embodiment, curved semiconductor chips are mounted both outside and inside the substrate 13.

FIG. 8 is directed to a combination of embodiments shown in FIGS. 1 and 5 and, thus, those portions which are equal to those shown in FIGS. 1 and 5 are denoted by the same reference numerals. In this case, a plurality of wirings and connection pads connected to these wirings are arranged both outside and inside the substrate 13. It is possible to mount the terminal 15 shown in FIG. 1 on any of the outside surface and the inside surface of the substrate 13.

On the other hand, the embodiment shown in FIG. 9 is substantially equal to the embodiment of FIG. 4, except that a curved semiconductor chip 91 is further mounted on the inner side of the substrate 13 in FIG. 9. Those portions which are equal to those shown in FIG. 4 are denoted by the same reference numerals in FIG. 9.

As described above, semiconductor chips are mounted on both the outer surface and the inner surface of the substrate 13 in the sixth embodiment, leading to a further improved mounting density.

(Seventh Embodiment)

Figure 10:
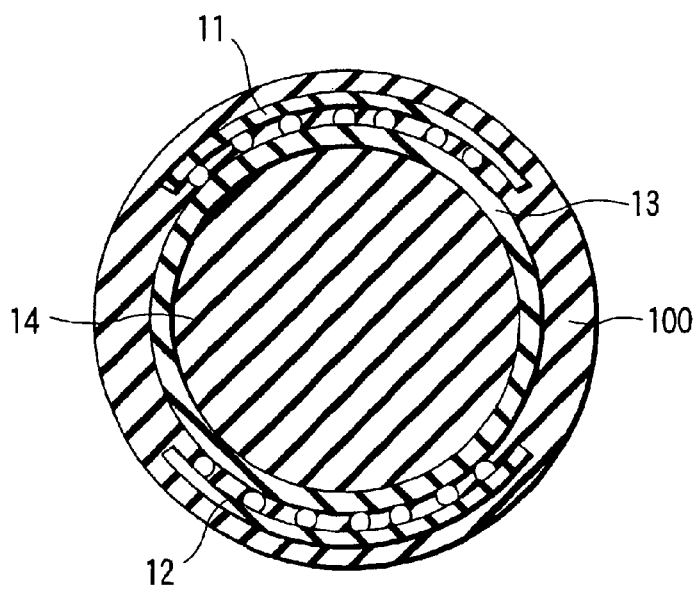
FIG. 10 is a cross sectional view showing a seventh embodiment of the present invention.

FIG. 10 shows a seventh embodiment of the present invention. This embodiment is a modification of the first embodiment. As shown in FIG. 10, the outer circumferential surface of the substrate 13 is covered with a resin layer 100.

Since the outer circumferential surface of the substrate 13 is covered with the resin layer 100 as shown in FIG. 10, it is possible to prevent the semiconductor chips 11 and 12 from being deteriorated. In addition, the handling of the semiconductor module can be facilitated.

The seventh embodiment can be applied to each of the second to sixth embodiments.

(Manufacturing Method)

The manufacturing method of the present invention will now be described.

Figure 11:
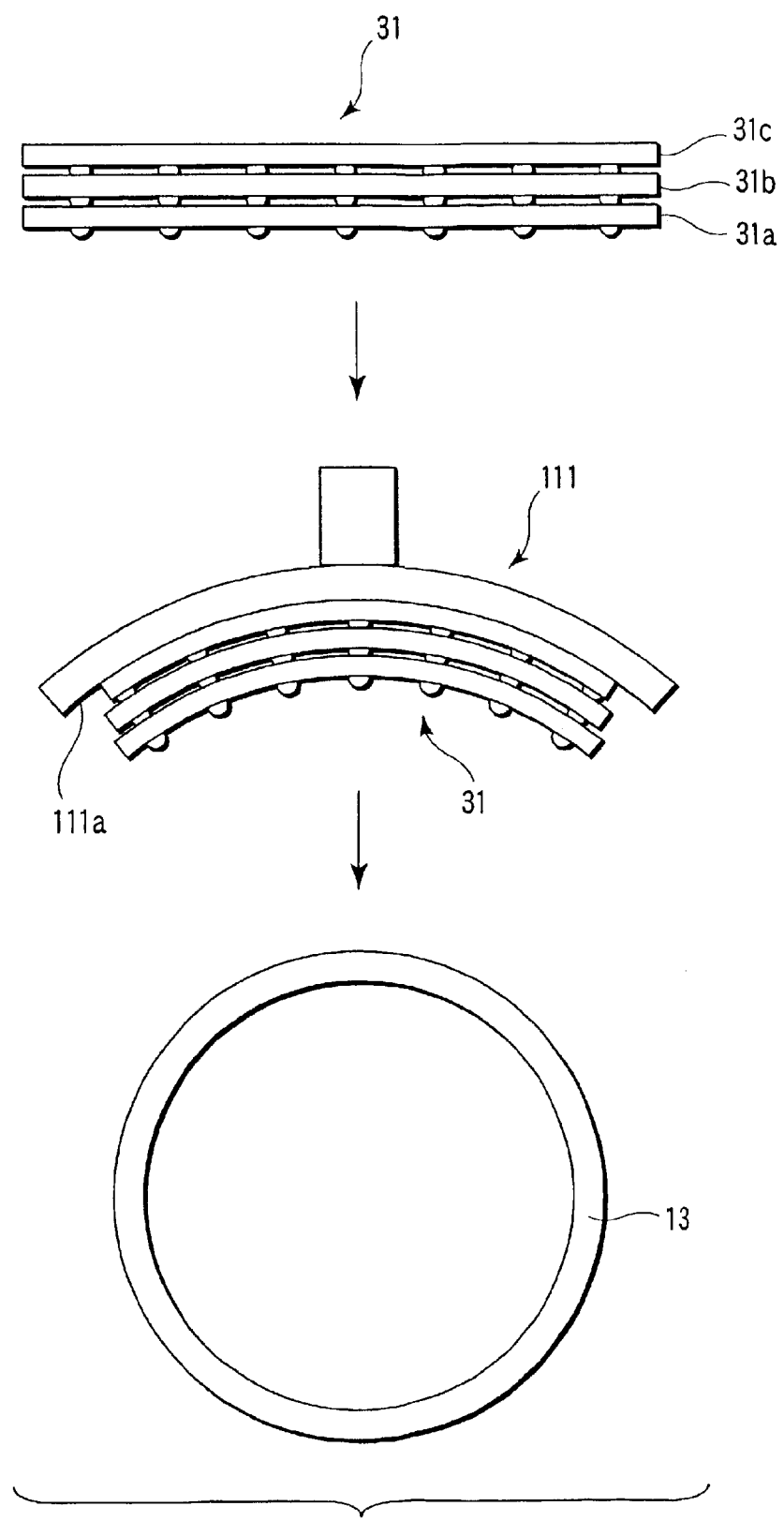
FIG. 11 is a side view showing a first manufacturing method of the present invention.

FIG. 11 shows a first manufacturing method of the present invention. The module shown in FIG. 3 can be manufactured as follows by the first manufacturing method.

In this case, the stacked body 31 is prepared first by stacking a plurality of semiconductor chips 31a, 31b and 31c. The stacked body 32 (not shown) is also prepared similarly. The stacked body 31 is drawn onto a pick-up tool 111 having, for example, a vacuum chuck. The suction surface 111a of the pick-up tool 111 is bent. Therefore, when drawn to the pick-up tool 111, the stacked body 31 is bent along the suction surface 111a. Under this condition, the stacked body 31 is mounted to the outer circumferential surface of, for example, the film-like substrate 13 formed into a cylindrical form in advance such that the bumps BP of the stacked body 31 is connected to the connection pads formed on the outer circumferential surface of the substrate 13. Then, the suction by the pick-up tool 111 is released so as to detach the stacked body 31 from the pick-up tool 111. In this fashion, the stacked body 31 is mounted to the outer circumferential surface of the substrate 13. Then, the stacked body 32 (not shown) is also mounted similarly to the outer circumferential surface of the substrate 13, thereby finishing the manufacture of the semiconductor module shown in FIG. 3.

The first manufacturing method described above can also be applied to the manufacture of the module shown in FIG. 1.

Figure 12:
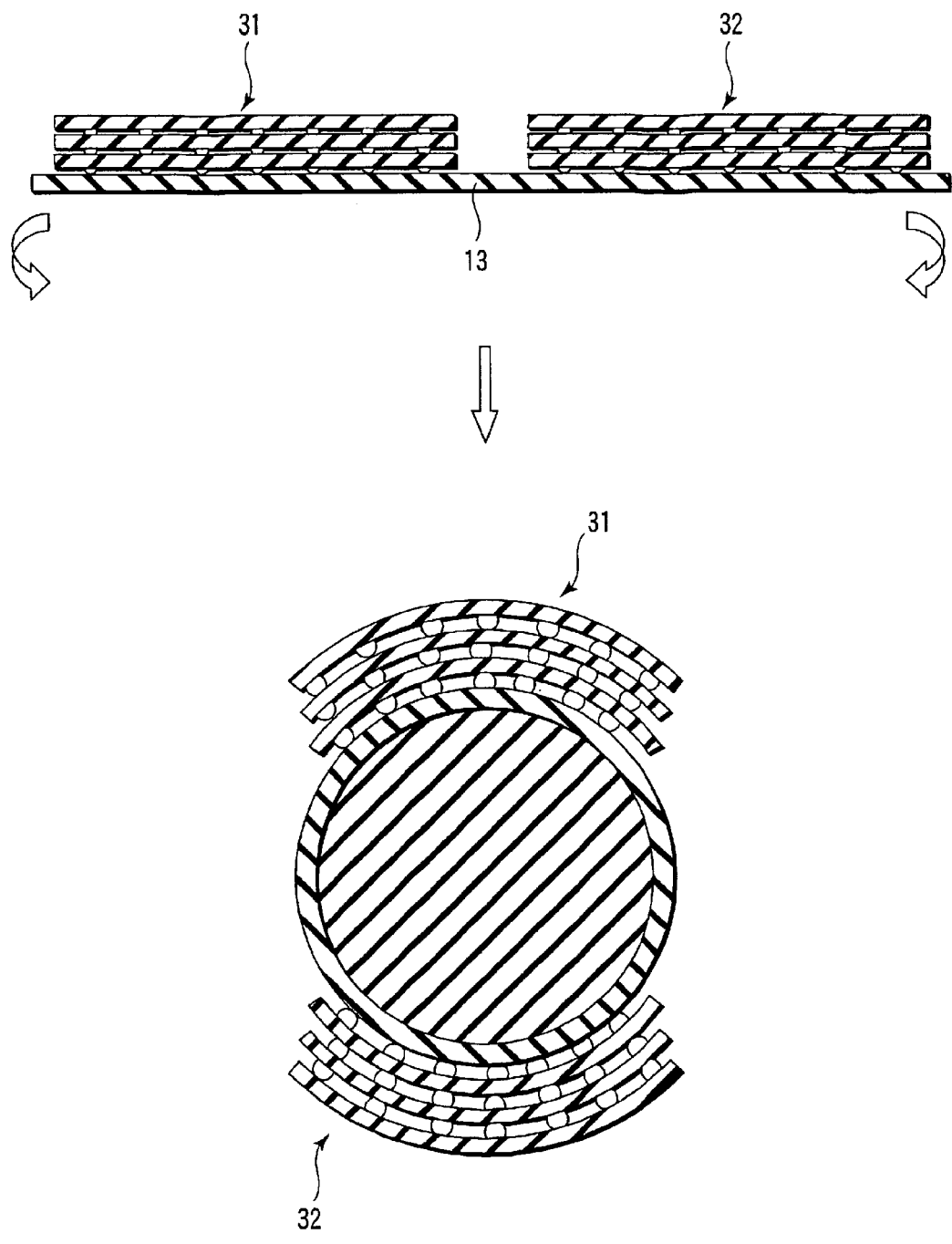
FIG. 12 is a cross sectional view showing a second manufacturing method of the present invention.

FIG. 12 shows a second manufacturing method of the present invention. The module shown in FIG. 3 can be manufactured as follows by employing the second manufacturing method.

In this case, prepared first are the stacked body 31 having a plurality of semiconductor chips 31a, 31b, 31c stacked one upon the other and the stacked body 32 having a plurality of semiconductor chips 32a, 32b, 32c stacked one upon the other. These stacked bodies 31 and 32 are mounted to the surface of, for example, a flat film-like substrate 13 such that the bumps BP of these stacked bodies 31, 32 are connected to the connection pads formed on the surface of the substrate 13. Then, the substrate 13 is bent such that the surface of the substrate 13 having the stacked bodies 31, 32 mounted thereon are positioned outside, and the both edges of the substrate 13 are connected to each other so as to form a cylindrical structure. Alternatively, it is possible to wind the substrate 13 around the columnar reinforcing body 14 in the step of bending the substrate 13. In this fashion, manufacture of the semiconductor module shown in FIG. 3 is finished.

Figure 13:
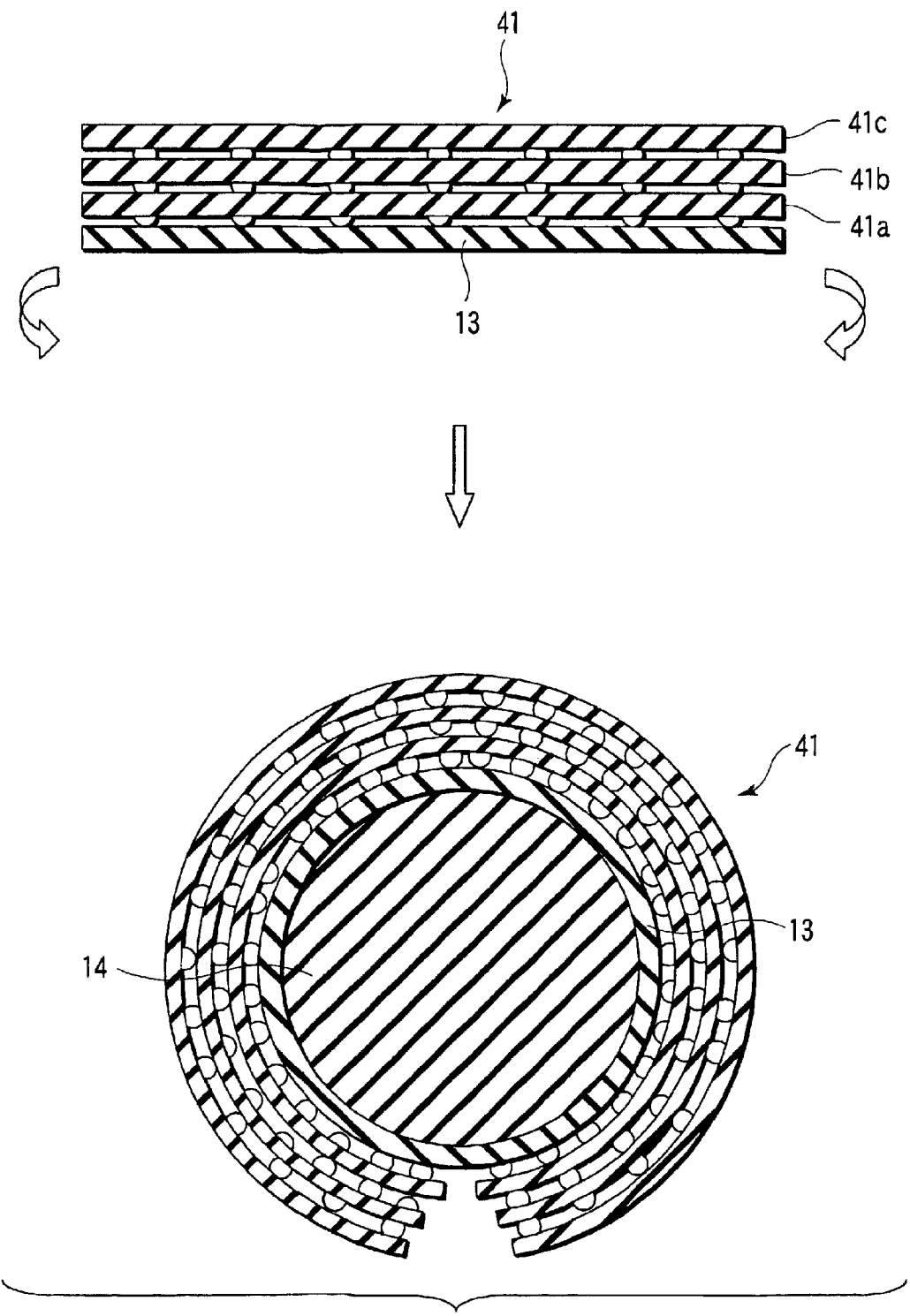
FIG. 13 is a cross sectional view showing a third manufacturing method of the present invention.

FIG. 13 covers the case where the semiconductor module shown in FIG. 4 is manufactured by the second manufacturing method. In the first step, the stacked body 41 is mounted to the flat film-like substrate such that the bumps BP of the stacked body are connected to the pads (not shown) of the substrate 13, in this case, too. Under this condition, the substrate 13 is bent as denoted by arrows. In this case, it is also possible to wind the substrate 13 around the reinforcing body 14. In this fashion, manufacture of the semiconductor module shown in FIG. 4 is finished.

The second manufacturing method described above can be applied to the manufacture of the semiconductor modules shown in FIGS. 1 and 5 to 9.

Figure 14:
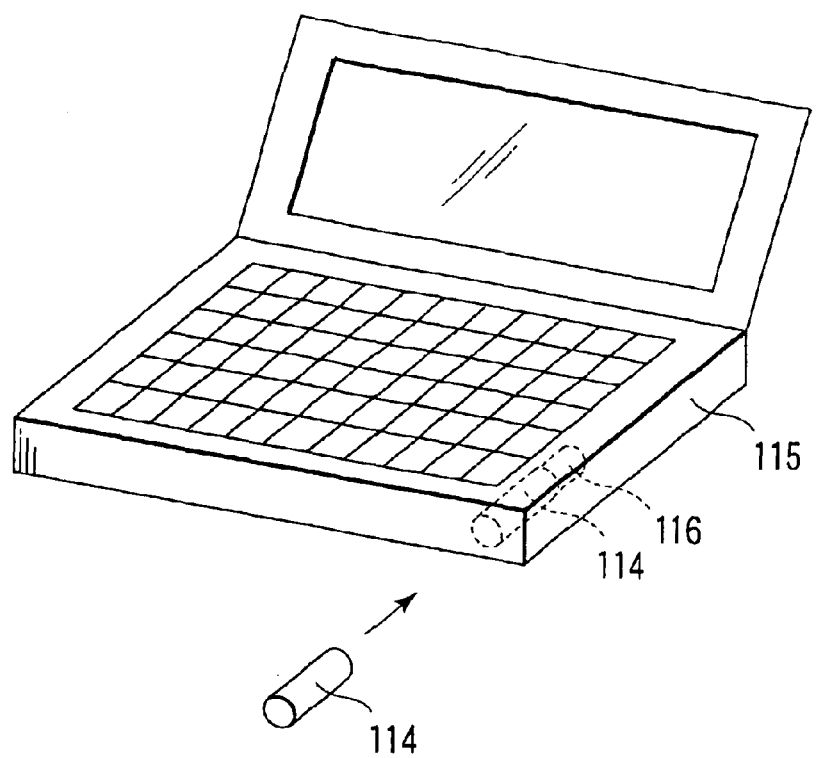
FIG. 14 is an oblique view showing an application of the present invention.
Figure 15:
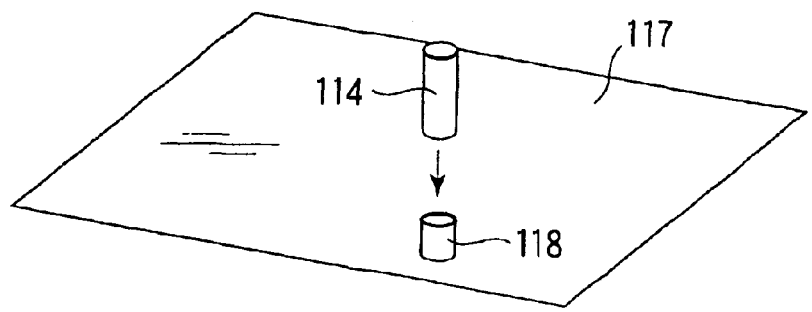
FIG. 15 is an oblique view showing another application of the present invention.

FIGS. 14 and 15 show applications of the semiconductor modules according to the first to seventh embodiments described above.

Specifically, FIG. 14 covers the case where a semiconductor module 114 of the present invention is applied to an external memory of, for example, a personal computer. In this case, a connector 116 is arranged inside the personal computer 115, and the semiconductor module 114 is mounted to the connector 116.

FIG. 15 covers the case where the semiconductor module 114 of the present invention is applied to an internal memory of, for example, a personal computer. In this case, a connector 118 is arranged in, for example, a mother board 117, and the semiconductor module 114 is mounted to the connector 118.

As described above, the semiconductor module 114 of the present invention can be made small, compared with the size of the chip. Therefore, where the semiconductor module of the present invention is applied to the external memory of a personal computer or a portable terminal apparatus or to an internal memory of, for example, a personal computer, it is possible to miniaturize these electronic apparatuses.

Needless to say, the present invention is not limited to the first to seventh embodiments described above. It is also possible apply the technical idea of the present invention to combinations of these first to seventh embodiments other than the combinations described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a cylindrical substrate having wirings formed thereon; and
   at least one semiconductor chip mounted on a circumferential surface of said substrate, said semiconductor chip being bent along the surface of said substrate and having bumps in contact with the wirings,
   wherein a diameter of the cylindrical substrate is smaller than a width of the at least one semiconductor chip.

2. The semiconductor device according to claim 1, wherein a plurality of semiconductor chips are mounted to an outer circumferential surface of said substrate a predetermined distance apart from each other in an outer circumferential direction of said substrate.

3. The semiconductor device according to claim 1, wherein a plurality of semiconductor chips are mounted to an outer circumferential surface of said substrate a predetermined distance apart from each other in a longitudinal direction of said substrate.

4. The semiconductor device according to claim 1, wherein said semiconductor chip is arranged to cover an entire outer circumferential surface of said substrate.

5. The semiconductor device according to claim 1, wherein said semiconductor chip is arranged on an inner circumferential surface of said substrate.

6. The semiconductor device according to claim 1, wherein a plurality of semiconductor chips are arranged on an inner circumferential surface of said substrate a predetermined distance apart from each other in an inner circumferential direction of the substrate.

7. The semiconductor device according to claim 1, wherein a plurality of semiconductor chips are arranged on an inner circumferential surface of said substrate a predetermined distance apart from each other in a longitudinal direction of the substrate.

8. The semiconductor device according to claim 1, wherein said semiconductor chip is arranged over an entire inner circumferential surface of said substrate.

9. The semiconductor device according to claim 1, wherein said semiconductor chips are arranged on both an outer circumferential surface and an inner circumferential surface of said substrate.

10. The semiconductor device according to claim 1, wherein an outer circumferential surface of said substrate is sealed with a resin layer.

11. The semiconductor device according to claim 1, wherein a reinforcing body is arranged inside said cylindrical substrate.

12. The semiconductor device according to claim 1, wherein a plurality of terminals for connection are arranged in one edge portion in a longitudinal direction of said cylindrical substrate, and said terminals are electrically connected to said semiconductor chip.

13. The device according to claim 1, wherein a diameter of the cylindrical substrate is not larger than one-third of the width of the at least one semiconductor chip.

14. A semiconductor device, comprising:
    a cylindrical substrate having wirings formed thereon; and
    at least one stacked body mounted on a circumferential surface of said substrate, said stacked body including a plurality of semiconductor chips stacked one upon the other and being bent along the surface of said substrate, wherein each of said semiconductor chips has bumps, the bumps formed on one of said semiconductor chips are connected to said wirings, and a diameter of the cylindrical substrate is smaller than a width of each of the semiconductor chips.

15. The semiconductor device according to claim 14, wherein a plurality of said stacked bodies are mounted to an outer circumferential surface of said substrate a predetermined distance apart from each other in an outer circumferential direction of said substrate.

16. The semiconductor device according to claim 14, wherein a plurality of said stacked bodies are arranged a predetermined distance apart from each other in a longitudinal direction of said substrate.

17. The semiconductor device according to claim 14, wherein said stacked body is arranged to cover an entire outer circumferential surface of said substrate.

18. The semiconductor device according to claim 14, wherein said stacked body is arranged on an inner circumferential surface of said substrate.

19. The semiconductor device according to claim 14, wherein a plurality of stacked bodies are arranged on an inner circumferential surface of said substrate a predetermined distance apart from each other in an inner circumferential direction of the substrate.

20. The semiconductor device according to claim 14, wherein a plurality of stacked bodies are arranged on an inner circumferential surface of said substrate a predetermined distance apart from each other in a longitudinal direction of the substrate.

21. The semiconductor device according to claim 14, wherein said stacked body is arranged over an entire inner circumferential surface of said substrate.

22. The semiconductor device according to claim 14, wherein said stacked bodies are arranged on both an outer circumferential surface and an inner circumferential surface of said substrate.

23. The semiconductor device according to claim 14, wherein an outer circumferential surface of said substrate is sealed with a resin layer.

24. The semiconductor device according to claim 14, wherein a plurality of terminals for connection are arranged in one edge portion in a longitudinal direction of said cylindrical substrate, and said terminals are electrically connected to said semiconductor chip.

25. The device according to claim 14, wherein a diameter of the cylindrical substrate is not larger than one-third of the width of each of the semiconductor chips.

26. A method of manufacturing a semiconductor device, comprising:
    bending at least one semiconductor chip; and
    mounting the bent semiconductor chip on at least one region of the surface of a cylindrical substrate,
    wherein said semiconductor chip is held by a holder having a curved surface in said bending step.

27. A method of manufacturing a semiconductor device, comprising:
    mounting at least one semiconductor chip having bumps on at least a region of a surface of a flexible substrate; and
    bending said substrate into a cylindrical form; wherein said chip is bent; and
    wherein a diameter of the cylindrical substrate is smaller than a width of the at least one semiconductor chip.

28. The device according to claim 27, wherein a diameter of the cylindrical substrate is not larger than one-third of the width of the at least one semiconductor chip.

29. A semiconductor module, comprising:
    a cylindrical substrate having wirings formed thereon;
    at least one semiconductor chip mounted on a circumferential surface of said substrate, said semiconductor chip being bent along the surface of said substrate and having bumps in contact with the wirings; and
    a plurality of terminals to be connected to connectors, the terminals being formed on the cylindrical substrate and connected to the wirings wherein a diameter of the cylindrical substrate is smaller than a width of the least one semiconductor chip.

30. The module according to claim 29, wherein the terminals are arranged on a peripheral portion of the substrate.

31. The module according to claim 29, wherein the connectors are provided in a computer.

32. The module according to claim 29 wherein the connectors are provided on a printed circuit board.

33. The device according to claim 29, wherein a diameter of the cylindrical substrate is not larger than one third of the width of the at least one semiconductor chip.

* * * * *